(12) United States Patent
Hogan et al.

(10) Patent No.: US 11,877,428 B2
(45) Date of Patent: Jan. 16, 2024

(54) MODULAR HORIZONTAL RACK MANIFOLD FOR LIQUID COOLING

(71) Applicant: DELL PRODUCTS, LP, Round Rock, TX (US)

(72) Inventors: Jordan C. Hogan, Austin, TX (US); Ben John Sy, Austin, TX (US); Steven Embleton, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 44 days.

(21) Appl. No.: 17/235,624

(22) Filed: Apr. 20, 2021

(65) Prior Publication Data

US 2022/0338384 A1 Oct. 20, 2022

(51) Int. Cl.
 *H05K 7/20* (2006.01)
(52) U.S. Cl.
 CPC ............................. *H05K 7/20772* (2013.01)
(58) Field of Classification Search
 CPC ........... H05K 7/20772; H05K 7/20781; H05K 7/20272
 See application file for complete search history.

(56) References Cited

U.S. PATENT DOCUMENTS

| | | | | |
|---|---|---|---|---|
| 5,447,256 A * | 9/1995 | Graham | ................... | B67D 1/16 141/357 |
| 6,828,675 B2 * | 12/2004 | Memory | ............... | F28D 7/0025 257/714 |
| 7,450,385 B1 * | 11/2008 | Campbell | .......... | H05K 7/20781 361/689 |
| 10,156,873 B2 | 12/2018 | Shelnutt et al. | | |
| 10,582,645 B1 * | 3/2020 | Kufahl | ............... | H05K 7/20781 |
| 10,881,030 B1 * | 12/2020 | Lunsman | .............. | H05K 7/1487 |
| 2007/0256957 A1 * | 11/2007 | Herrmann | .......... | H05K 7/20645 206/710 |
| 2010/0175852 A1 * | 7/2010 | Peterson | ............ | H05K 7/20809 165/80.2 |
| 2010/0252234 A1 * | 10/2010 | Cambell | ............... | H01L 23/473 165/80.2 |
| 2011/0026225 A1 * | 2/2011 | Ostwald | ............ | H05K 7/20645 165/104.31 |
| 2014/0085821 A1 * | 3/2014 | Regimbal | .............. | H05K 7/207 361/699 |
| 2016/0007503 A1 * | 1/2016 | Druzhinin | ................ | G06F 1/20 361/699 |

(Continued)

*Primary Examiner* — Stephen S Sul
(74) *Attorney, Agent, or Firm* — Larson Newman, LLP

(57) ABSTRACT

A modular manifold system for liquid cooling in information handling system includes first and second horizontal manifolds, and a drip tray. The first horizontal manifold includes a first group of quick-disconnects and a first main water connector. The first main water connector extends away from a first end of the first horizontal manifold. The second horizontal manifold includes a second group of quick-disconnects and a second main water connector. The second main water connector extends away from a second end of the second horizontal manifold. The drip tray is connected to a third surface of the second horizontal manifold, and extends away from the second horizontal manifold in a direction perpendicular to the second surface. The drip tray catches any water leaked from one or more of the first and second quick-disconnects.

20 Claims, 12 Drawing Sheets

(56) References Cited

U.S. PATENT DOCUMENTS

| | | | |
|---|---|---|---|
| 2016/0044833 A1* | 2/2016 | Krishnan | H05K 7/203 165/80.4 |
| 2016/0113150 A1* | 4/2016 | Krug, Jr. | H05K 7/20781 165/104.31 |
| 2016/0356558 A1* | 12/2016 | Franz | F28F 9/0202 |
| 2017/0127575 A1* | 5/2017 | Lunsman | H05K 7/20263 |
| 2020/0146188 A1 | 5/2020 | Shelnutt et al. | |
| 2020/0163251 A1* | 5/2020 | Chopra | F24F 13/222 |
| 2020/0191504 A1* | 6/2020 | Chen | H05K 7/20781 |
| 2022/0026105 A1* | 1/2022 | Tsao | F24F 13/222 |

* cited by examiner

MODULAR HORIZONTAL RACK MANIFOLD FOR LIQUID COOLING

FIELD OF THE DISCLOSURE

The present disclosure generally relates to information handling systems, and more particularly relates to a modular horizontal rack manifold for liquid cooling.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A modular manifold system for liquid cooling in information handling system includes first and second horizontal manifolds, and a drip tray. The first horizontal manifold includes a first group of quick-disconnects, and a first main water connector. The first quick-disconnects are mounted along a first surface of the first horizontal manifold. The first main water connector is mounted on the first surface and extends away from a first end of the first horizontal manifold. The second horizontal manifold includes a second group of quick-disconnects and a second main water connector. The second quick-disconnects are mounted along a second surface of the second horizontal manifold. The second main water connector is mounted on the second surface and extends away from a second end of the second horizontal manifold. The drip tray is connected to a third surface of the second horizontal manifold and extends away from the second horizontal manifold in a direction perpendicular to the second surface. The drip tray catches any water leaked from one or more of the first and second quick-disconnects.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 16 is a block diagram of a general information handling system according to at least one embodiment of the present disclosure.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
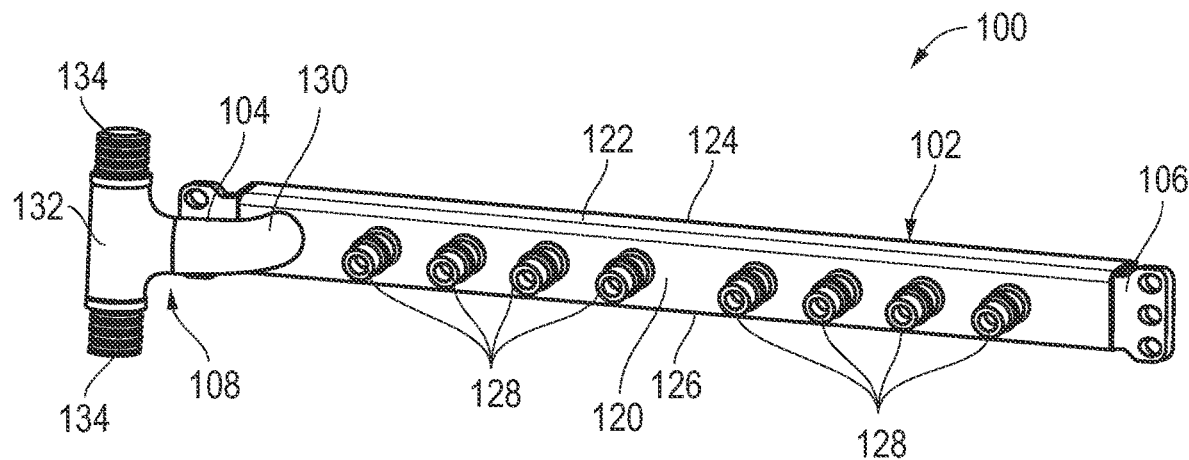
FIG. 1 is a diagram of a return horizontal manifold according to at least one embodiment of the disclosure.

FIG. 1 illustrates a return horizontal manifold 100 according to at least one embodiment of the disclosure. Return horizontal manifold 100 includes a main portion 102, mounting brackets 104 and 106, and a main water connector 108. Main portion 102 includes a front surface 120, a top surface 122, a back surface 124, and a bottom surface 126. Main portion 102 also includes one or more quick-disconnects 128 mounted on front surface 120. Main water connector 108 includes an attachment portion 130, a splitter 132, and connectors 134. In an example, mounting brackets 104 and 106 may allow main portion 102 to be mounted with a 1 U space of a server rack. In certain examples, return horizontal manifold 100 may include other components not illustrated in FIG. 1 without varying from the scope of this disclosure.

In an example, main portion 102 may be hollow, such that water may flow through the main portion. For example, a thickness of each of front surface 120, top surface 122, back surface 124, and bottom surface 126 may be substantially less than the overall thickness of main portion 102 to enable the water flow through the main portion. In an example, quick-disconnects 128 may enable hoses to couple return horizontal manifold 100 to one or more components of an information handling system. For example, each quick-disconnect 128 may be connected to a hose, which in turn may connect to a liquid cooling system of a component within the information handling system. In certain examples, the hose in between the liquid cooling system of the component, and return horizontal manifold 100 may enable water flow from the liquid cooling system to the return horizontal manifold. In an example, latches 104 and 106 may be utilized in any suitable manner to secure return horizontal manifold 100 to a server rack as will be described below with respect to FIG. 3.

In an example, attachment portion 130 of main water connector 108 may be mounted on front surface 120 and may extend away from the front surface in any suitable direction. For example, attachment portion 130 may extend in a direction that is perpendicular to front surface 120. In an example, attachment portion 130 may extend a predetermined length from front surface 120, and at that point the attachment portion may bend and further extend in any suitable direction. For example, attachment portion 130 may bend at an angle such that the attachment portion extends away from main portion 102 in a direction that is substantially parallel to front surface 120. In certain examples, splitter 132 may be in physical communication with a distal end of attachment portion 130 as compared to an end of the attachment portion connected to front surface 120. Each connector 134 may be connected to a different end of splitter 132, and the connectors may extend from the splitter in any suitable direction. For examples, connectors 134 may extend in a vertical direction, such that the connectors are perpendicular with respect to top surface 122 and bottom surface 126 of main portion 102. In an example, connectors 134 may include any suitable hose connection including, but not limited to, a barb fitting.

In certain examples, main water connector 108 may be utilized to provide water from horizontal manifold 100 to a central cooling for multiple information handling systems or server racks. In an example, main water connector 108 may be coupled to additional return horizontal manifolds as will be described below.

Figure 2:
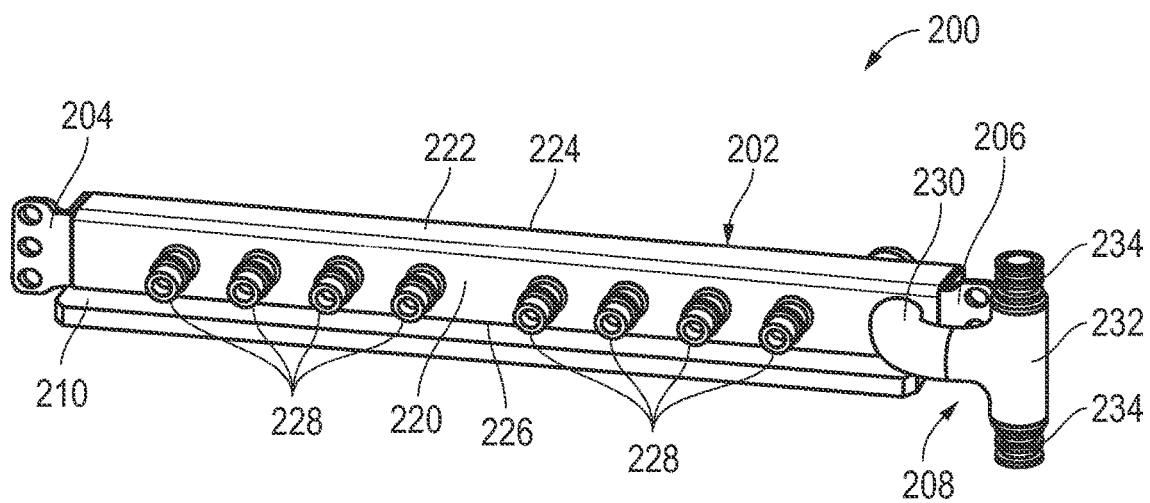
FIG. 2 is a diagram of a supply horizontal manifold according to at least one embodiment of the disclosure.

FIG. 2 illustrates a supply horizontal manifold 200 according to at least one embodiment of the disclosure. Supply horizontal manifold 200 includes a main portion 202, mounting brackets 204 and 206, a main water connector 208, and a drip tray 210. Main portion 202 includes a front surface 220, a top surface 222, a back surface 224, and a bottom surface 226. Main portion 202 also includes one or more quick-disconnects 228 mounted on front surface 220. Main water connector 208 includes an attachment portion 230, a splitter 232, and connectors 234. In an example, mounting brackets 204 and 206 may allow main portion 202 to be mounted with a 1 U space of a server rack. In certain examples, supply horizontal manifold 200 may include other components not illustrated in FIG. 2 without varying from the scope of this disclosure.

In an example, main portion 202 may be hollow, such that water may flow through the main portion. For example, a thickness of each of front surface 220, top surface 222, back surface 224, and bottom surface 226 may be substantially less than the overall thickness of main portion 202 to enable the water flow through the main portion. In an example, quick-disconnects 228 may enable hoses to couple supply horizontal manifold 200 to one or more components of an information handling system. For example, each quick-disconnect 228 may be connected to a hose, which in turn may connect to a liquid cooling system of a component within the information handling system. In certain examples, the hose in between the liquid cooling system of the component and supply horizontal manifold 200 may enable water flow from the supply horizontal manifold to the liquid cooling system. In an example, latches 204 and 206 may be utilized in any suitable manner to secure supply horizontal manifold 200 to a server rack as will be described below with respect to FIG. 4.

In an example, attachment portion 230 of main water connector 208 may be mounted on front surface 220 and may extend away from the front surface in any suitable direction. For example, attachment portion 230 may extend in a direction that is perpendicular to front surface 220. In an example, attachment portion 230 may extend a predetermined length from front surface 220, and at that point the attachment portion may bend and further extend in any suitable direction. For example, attachment portion 230 may bend at an angle such that the attachment portion extends away from main portion 202 in a direction that is substantially parallel to front surface 220. In certain examples, splitter 232 may be in physical communication with a distal end of attachment portion 230 as compared to an end of the attachment portion connected to front surface 220. Each connector 234 may be connected to a different end of splitter 232, and the connectors may extend from the splitter in any suitable direction. For examples, connectors 234 may extend in a vertical direction, such that the connectors are perpendicular with respect to top surface 222 and bottom surface 226 of main portion 202. In an example, connectors 234 may include any suitable hose connection including, but not limited to, a barb fitting.

In certain examples, main water connector 208 may be utilized to provide water from a central cooling system supply line to horizontal manifold 200. In an example, main water connector 208 may be coupled to additional supply horizontal manifolds as will be described below.

In an example, drip tray 210 may be in physical communication with bottom surface 226. One end of drip tray 210 may be in physical communication with latch 204 and another distal end of the drip tray may be in physical communication with latch 206. In certain examples, drip tray 210 may extend any suitable distance away from front surface 220. For example, drip tray 210 may extend beyond the ends of quick-disconnects 228. In this example, any leaking or dripping of water from the connection between quick-disconnects 228 and respective hoses may be caught by drip tray 210. Based on the water being caught within drip tray 210, components of an information handling system may be protected from water damage. In an example, return horizontal manifold 100 of FIG. 1 may be installed substantially above supply horizontal manifold 200 within an information handling system, such that any leaking or dripping of water from the connection between quick-disconnects 128 and respective hoses may be caught by drip tray 210. In certain examples, any suitable number of return horizontal manifolds 100 and supply horizontal manifolds 200 may be utilized in a server rack.

Figure 3:
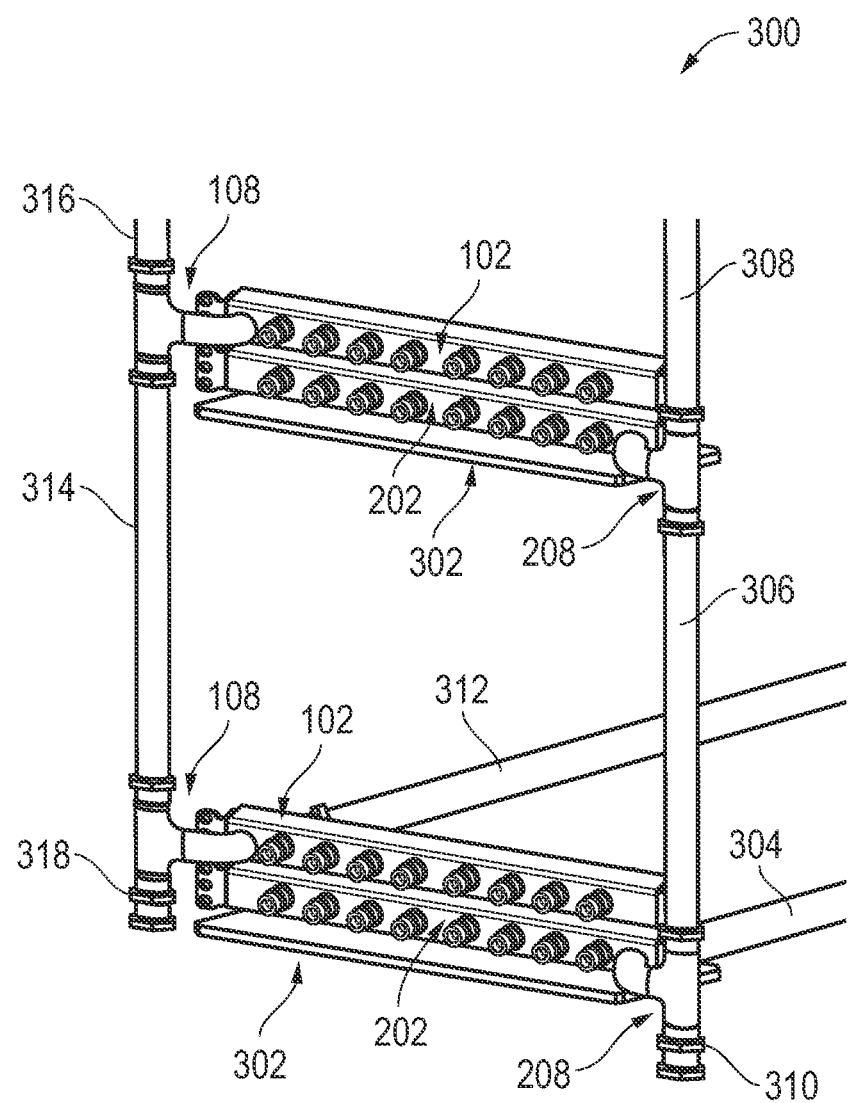
FIG. 3 is a diagram of a modular horizontally oriented manifold system according to at least one embodiment of the disclosure.

FIG. 3 illustrates a modular horizontally oriented manifold system 300 according to at least one embodiment of the disclosure. The modular manifold system 300 includes multiple manifold units 302, main supply lines 304, 306, and 308, supply line cap 310, main return lines 312, 314, and 316, and return line cap 318. Each manifold unit 302 includes a supply manifold 202 and a return manifold 102. In an example, manifolds 102 and 202 may be horizontally orientated within the manifold system 300 as shown in FIG. 3.

In certain examples, main supply line 304 may connect with supply manifold 202 of a manifold unit 302 to provide cold water to modular manifold system 300. In an example, supply manifold 202 may distribute the cold supply water to one or more devices via quick-disconnects, such as quick-disconnects 228 of FIG. 2. Supply manifold 202 may also provide the cold water to main supply water line, such as main supply water line 306, via one end of main water connector 208. If supply manifold 202 is a lowest supply manifold in manifold system 300, the other end of main water connector may be attached to a supply line cap 310.

In an example, main supply line 306 may provide the cold supply water to the next supply manifold 202 in the supply line. For example, main supply line 306 may be connected to main water connector 208, which in turn may provide the cold supply water to quick-disconnects of supply manifold 202 and to main supply line 308. In certain examples, supply manifolds 202 may be continuously added in the supply line as more devices are added to a server rack. In this examples, supply manifolds 202 may be daisy chained together to provide cold water to multiple devices. As more devices are added, additional manifold units 302 may be added without having to bring down existing manifold units of the manifold system 300.

In certain examples, one or more devices may utilize the cold water from supply manifold 202 to cool, via liquid cooling, and provide hot return water to an associated return manifold 102 via one or more quick-disconnects, such as quick-disconnects 128 of FIG. 1. In an example, return manifold 102 may provide hot water from the one or more devices via main water connector 108. Main water connector 108 may also receive hot water from main return line 316, and provide the hot water to main return line 314. In certain examples, one end of main water connector 108 of a lowest most return manifold 102 may receive hot water from main return line 314, and the other end of the main water connector may be connected to a return line plug or cap 318. In these examples, return line plug 318 may force the hot water into the return manifold 102 via main water connector 108. The lowest return manifold 102 may also receive hot water from devices connected to the return manifold via quick-disconnects, such as quick-disconnects 128 of FIG. 1. In an example the lowest return manifold 102 may then provide the received hot water to main return line 312, which in turn may provide the hot water to a facility cooling component.

Figure 4:
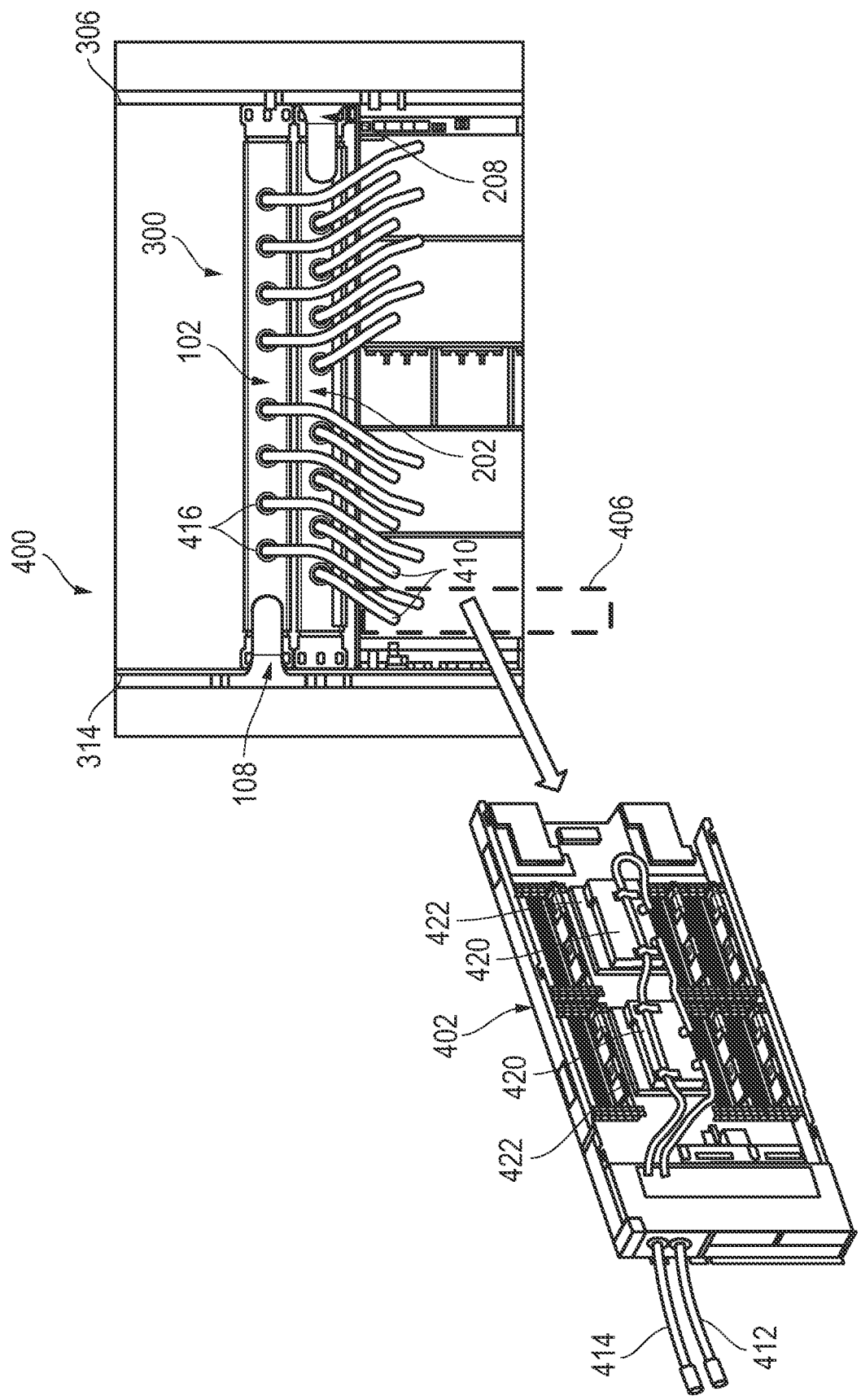
FIG. 4 is a diagram of a portion of a server rack including a portion of a modular horizontally oriented manifold system and a server blade according to at least one embodiment of the disclosure.

FIG. 4 illustrates a portion of a server rack 400, which includes a portion of modular horizontally oriented manifold system 300 and a server blade 402 according to at least one embodiment of the disclosure. In an example, server blade 402 may be inserted within slot 406 of server rack 400, and the server blade may receive cold water from supply manifold 202 and provide hot water to return manifold 102. Supply manifold 202 may include multiple hoses 410 connected to the quick-disconnects of the supply manifold, and these hoses may be connected to a supply hose 412 of server blade 402. Similarly, return manifold may include multiple hoses 414 connected to the quick-disconnects of the return manifold, and these hoses may be connected to a return hose 414 of server blade 402. In an example, server blade 402 may provide the cold water from supply hose 412 to one or more liquid heat exchangers 420, which in turn may provide liquid cooling to corresponding processors 420.

In certain examples, supply manifold 202 may include any suitable number of quick-disconnects to interface with any suitable number of hoses 410, and return manifold 102 may include a corresponding number of quick-disconnects to interface with a corresponding number of hoses 416. In these examples, the number of quick-disconnects and number of hoses 410 and 416 may equal the number of server blades 402 to interface with supply manifold 202 and return manifold 102. As shown in FIG. 4, supply manifold 202 and return manifold 102 may be horizontally oriented, and the manifolds may interface with server blades above or below the supply manifold and return manifold. In an example, hoses 410, 412, 414, and 416 may be short in length, which may enable a simplified, logical routing solution in the front of server rack 400.

In an example, manifold unit 300 may be added to server rack 400 after a set of server blades with liquid cooling has been added. In this example, each pair of quick-disconnects in supply manifold 202 and return manifold 102 may be connected to respective hoses 412 and 414 of a corresponding server blade 402. In response to all of the quick-disconnects of supply manifold 202 and return manifold 102 being utilized, none of the quick-disconnects need to be plugged as in previous information handling systems. In previous information handling systems, the supply and return manifolds of a manifold system would be installed vertically in the rear of a server rack. In these systems, hoses from the manifolds to the devices may interfere with cable routing, installation, and removal of the devices, which are typically performed at the rear of the server rack. Also, in previous information handling systems, the manifold systems are not scalable, such that all possible quick-disconnects in the manifold system are installed during the initial installation. The unused quick-disconnects would be plugged while increasing cost and weight in previous server racks.

Modular front horizontal manifold system 300 improves an information handling system including, but not limited to, a server rack with one or more devices. For example, hoses 410 of supply manifold 202 and hoses 416 of return manifold 102 may be routed in the front of server rack 400, such that devices within the server rack may be serviceable from the rear. In an example, the devices within server rack 400 may be any suitable devices including, but not limited to, server blades 402, cooling fans, hard drivers, and power supplies.

In certain examples, manifold system 300 may utilize a minimum amount of space within server rack 400. For example, main supply line 306 and main return line 314 may be routed parallel to each other and positioned in the front of the server rack. The routing of main supply line 306 and main return line 314 may result in a 0 U space of server rack 400. In an example, supply manifold 202 and return manifold 102 of manifold unit 300 may utilize 2 U space within server rack 400.

Figure 5:
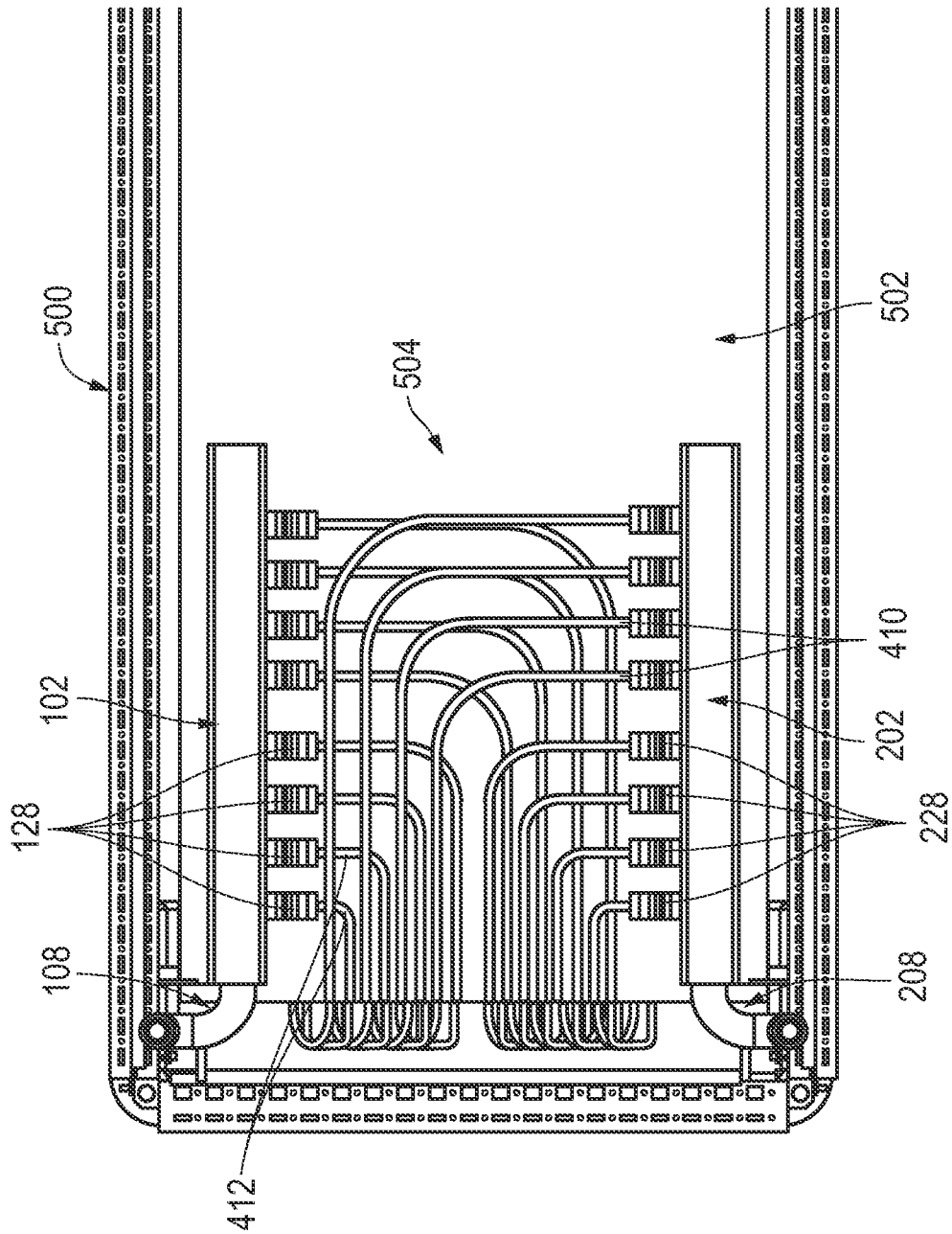
FIG. 5 is a diagram of a top view of a rack with a modular horizontally oriented manifold system according to at least one embodiment of the disclosure.
Figure 6:
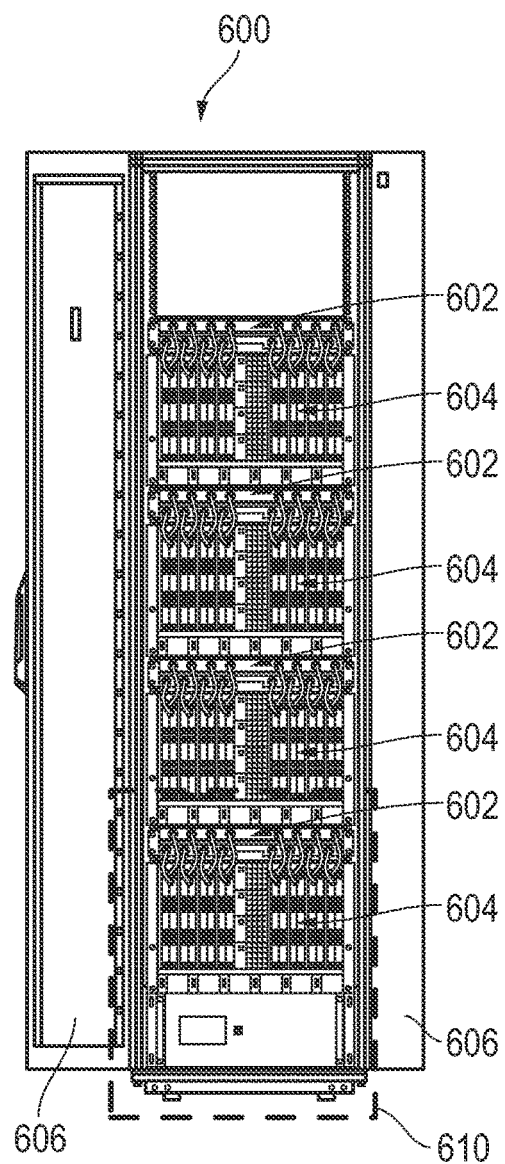
FIGS. 6-10 are diagrams of different views of a server rack according to at least one embodiment of the disclosure.

FIG. 5 illustrates top view of a server rack 500 including servers 502 and a modular horizontally oriented manifold system 504 according to at least one embodiment of the disclosure. In an example, server blades 502 may be inserted within server rack 500, and each server blade may include liquid cooling components. Manifold system 504 includes supply manifold 202 and return manifold 102. Supply manifold 202 includes main water connector 208 and multiple quick-disconnects 228. Return manifold 102 includes main water connector 108 and multiple quick-disconnects 128. In an example, main water lines may extend parallel to each other as explained above with respect to FIG. 4, and main supply line may be connected to main water connector 208 of supply manifold 202. Similarly, main return line may be connected to main water connector 108 of return manifold 102.

In an example, main water connector 208 may extend from an end of supply manifold 202 and bend to connect with the main supply line. In this example, the shape of main water connector 208 may enable supply manifold 202 to be mounted and extend along a depth of server rack 500. Main water connector 108 may extend from an end of return manifold 102 and bend to connect with the main return line. In this example, the shape of main water connector 108 may enable return manifold 102 to be mounted and extend along a depth of server rack 500. Based on supply manifold 202 and return manifold 102 extending along the depth of server rack 500, manifold system 504 may fit within a 1 U form factor. In an example, manifold system 504 having a horizontal 1 U form factor may enable server rack 500 to be more dense with devices 502.

Supply manifold 202 may include multiple hoses 410 connected to quick-disconnects 228 of the supply manifold, and these hoses may be connected to devices 502. Similarly, return manifold 102 may include multiple hoses 412 connected to quick-disconnects 118 of the return manifold, and these hoses may be connected to devices in server rack 500. In an example, hoses 410 and 412 may be routed along pre-defined paths to the front of server rack 500. In this example, the pre-defined paths may enable each of hoses 410 and 412 to have a proper bend radius to ensure flow of water to devices 502.

FIGS. 6-10 illustrate different views of a server rack 600 according to at least one embodiment of the disclosure. Server rack 600 includes multiple manifold units 602, multiple sets of devices 604, and front doors 606. In an example, after a set of devices 604 is inserted within server rack 600, a corresponding manifold unit 602 may be inserted within the server rack. In this example, the manifold system may be scalable by an individual manifold unit 602 is not added to server rack 600 until a corresponding set of devices 604 is added to the server rack.

In an example, each manifold unit 602 may be a self-contained system. For example, an individual manifold unit 602 and associated hoses may be filled with water, tested, and then shipped to a user of server rack 600. In this example, manifold unit 602 may be connected with manifold units already inserted within server rack 600. In an example, the length of manifold unit 602 may be any suitable length including, but not limited to, a width of server rack 600, such as six hundred millimeters. As described above with respect to FIG. 4, the main supply and return water lines may be located within a recessed portion of server rack 600. In an example, the main supply and return water lines may be located within the same 2 U space of server rack 600 as manifold unit 602. In these examples, front doors 606 may fit and close with the manifold units 602 installed within server rack 600. A portion 610 of server rack 600 is shown in FIG. 7.

Figure 7:
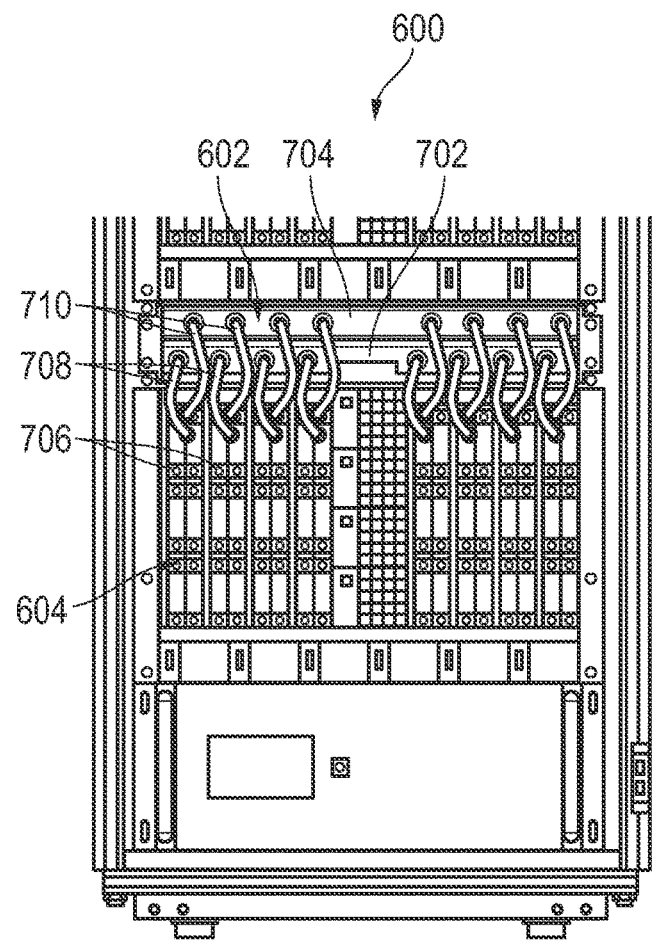

Referring now to FIG. 7, a manifold unit 602 includes a supply manifold 702 and a return manifold 704. Set of devices 604 includes any suitable number of devices 706. In an example, supply manifold 702 may include any suitable number of quick-disconnects with hoses 708 including, but not limited to, the same number as the number of devices 706 in set of devices 604. Similarly, return manifold 704 may include any suitable number of quick-disconnects with hoses 710 including, but not limited to, the same number as the number of devices 706 in set of devices 604.

In an example, the quick-disconnects and hoses 708 and 710 may face the front of server rack 600 to allow a user to easily inspect the quick-disconnects and hoses. In certain examples, a length of each hose 708 or 710 may be set to the distance between manifold unit 602 and a corresponding device 706. In these examples, an amount of airflow restrictions in the front of server rack 600 caused by hoses 708 and 710 may be minimized.

Figure 8:
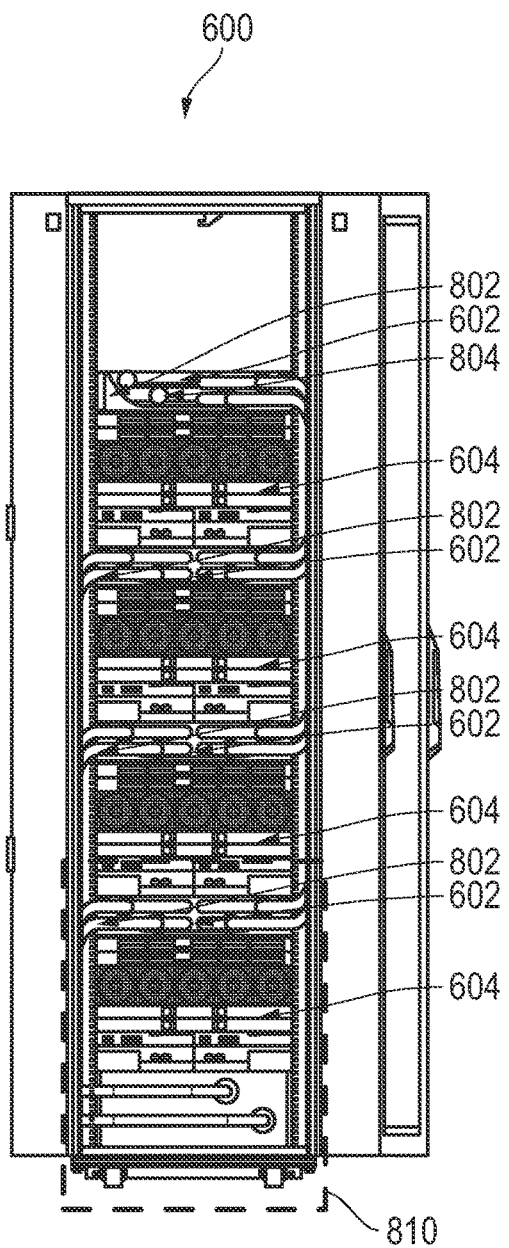

Referring now to FIG. 8, server rack 600 includes multiple drip pans 802. In an example, each drip pan 802 may be located under a corresponding manifold unit 602. In this example, drip pan 802 may prevent water from manifold unit 602 damaging set of devices 604 below the manifold unit. In an example, a top most manifold unit 602 within server rack 600 may include a plug or vent 804. In this example, plug or vent 804 may be installed at supply manifold of the top most manifold unit 602 within server rack 600. As additional manifold units 602 are added to server rack 600, plug or vent 804 may be removed from a current manifold unit and connected to the newly added manifold unit. As manifold units 602 are removed from server rack 600, plug or vent 804 may be removed from the manifold unit being removed and connected to the next down manifold unit. In an example, plug or vent 804 may be located in a 0 U space of server rack 600, such as above drip pan 802. A portion 810 of server rack 600 is shown in FIG. 9.

Figure 9:
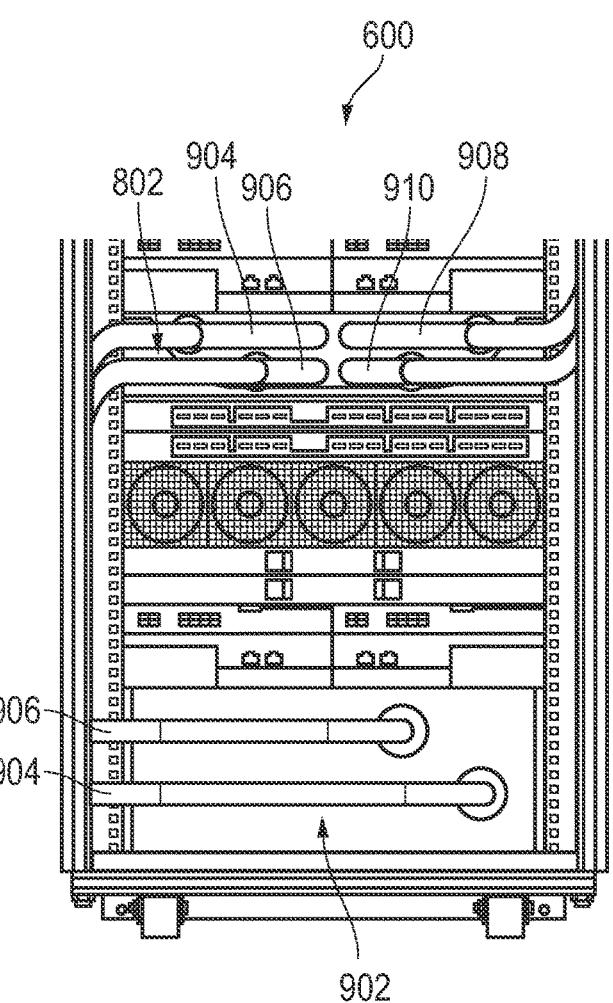

Referring now to FIG. 9, server rack 600 includes a main water distribution device 902. A main supply water line 904 and a main return water line 906 may be connected to the main water distribution device 902. As shown in FIG. 9, main supply water line 904 and main return water line 906 may be routed within a 0 U space of server rack 600. Main supply water line 904 and main return water line 906 also may be routed so that the devices in server rack 600 may be accessible from the rear of the server rack without the main supply and return water lines needing to be removed. In an example, the routing of main supply water line 904 and main return water line 906 may enable only hoses associated with a device being serviced to be removed or disconnected.

Figure 10:
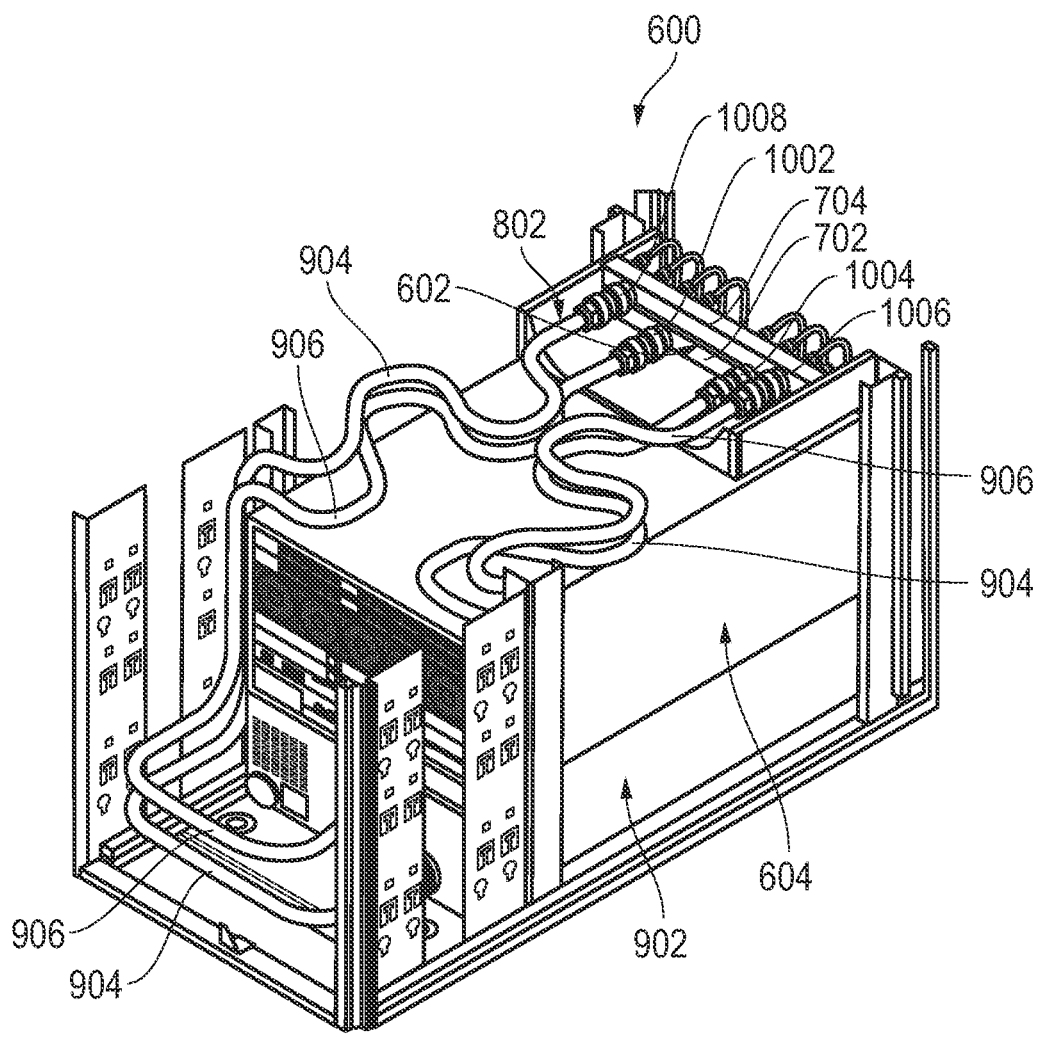

Referring now to FIG. 10, supply manifold 702 includes quick-disconnects 1002 and 1004, return manifold 704 includes quick-disconnects 1006 and 1008. In the example illustrated in FIGS. 6-10, main supply water line 904 and main return water line are routed from the rear of server rack 600 and located within 0 U spaces of the server rack. In an example, quick-disconnect 1002 may be connected to main supply water line 904 to receive cold water from water distribution unit 902. The cold water may be provided to another supply manifold via quick-disconnect 1004 and another portion of main supply water line 904. In an example, quick-disconnect 1006 may be connected to main return water line 906 to receive hot water from another return manifold. The hot water may be provided to water distribution unit 902 via quick-disconnect 1008 and another portion of main supply water line 906. In certain examples, supply manifold 702 and return manifold 704 may rotate around one end of the manifolds and latch to server rack 600 on the other end of the manifold. The rotating of supply manifold 702 and return manifold 704 may enable quick-disconnects 1002, 1004, 1006, and 1008 to be serviced with the supply and return manifolds being removed from server rack 600. In an example, drip pan 802 may be located under manifold unit 602 and on top of set of devices 604. In this example, drip pan 802 may prevent water from manifold unit 602 damaging set of devices 604 below the manifold unit.

Figure 11:
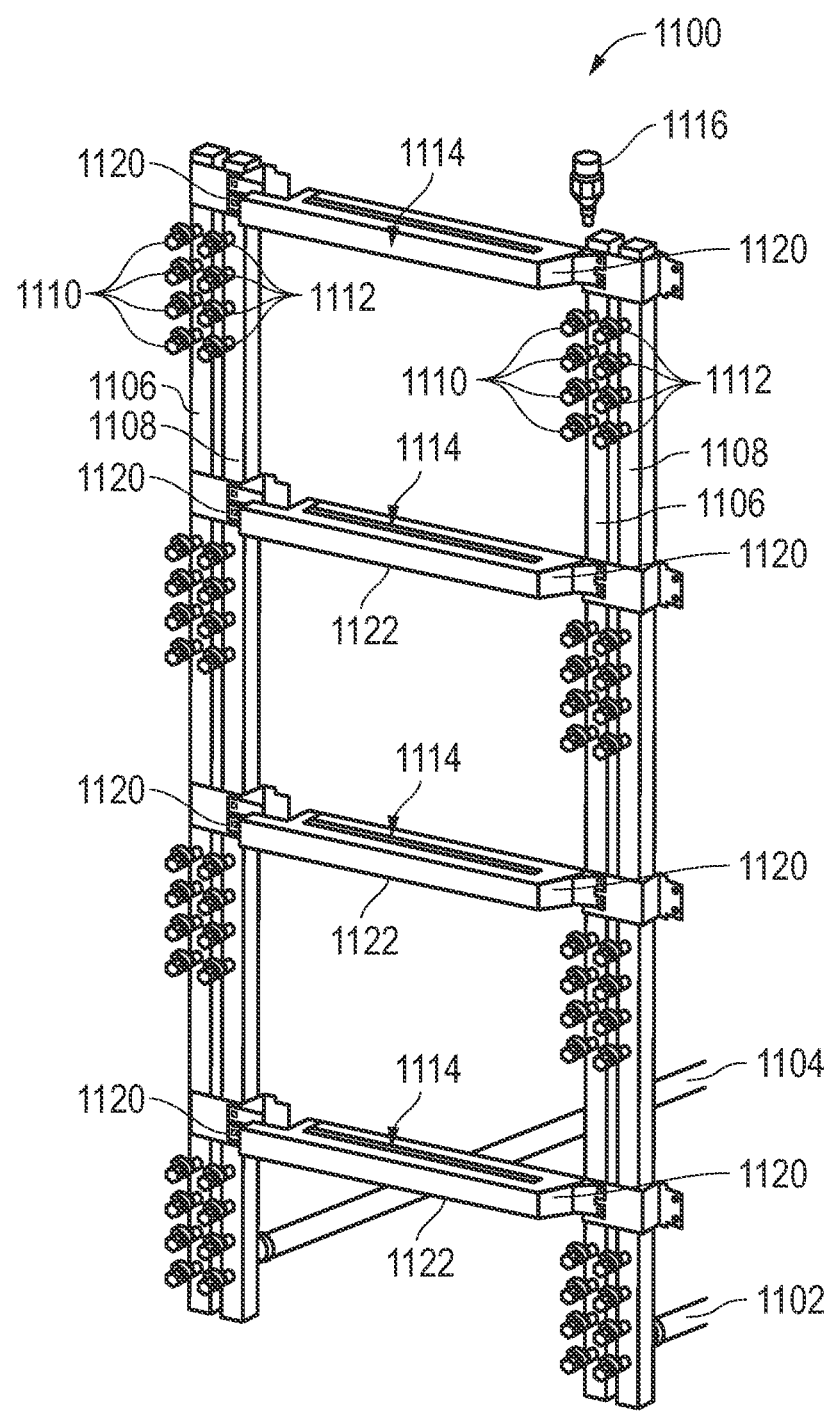
FIG. 11 is a diagram of a vertical manifold system with hose routing components according to at least one embodiment of the disclosure.

FIG. 11 illustrates a vertical manifold system 1100 according to at least one embodiment of the disclosure. Manifold system 1100 includes a supply water line 1102, a return water line 1104, supply manifolds 1106, return manifolds 1108, quick-disconnects 1110 on the supply manifolds, quick-disconnects 1112 on the return manifolds, hose guides 1114, and a plug or vent 1116. Each hose guide 114 includes an opening 1120 at each end of the hose guide, and multiple routing holes 1122 along a bottom surface of the hose guide.

In an example, plug or vent 1116 may be connected to the top of supply manifold 1106 via any suitable manner. For example, vent 1116 may be mounted to supply manifold 1106 by a threaded connection. In certain examples, vent 1116 may be utilized to release any air in the cold water line.

In certain examples, hose guides 1114 may be mounted in a horizontal orientation in between one set of supply and return manifolds and another set of supply and return manifolds. Hose guides 1114 may be made from any suitable material including, but not limited to, metal. In an example, hoses from quick-disconnects 1110 and 1112 may be routed through openings 1120 and into a main portion of hose guide 1114. The hoses may then be routed down through the routing holes 1122 to corresponding devices for liquid cooling. In an example, hose guides 1114 may enable devices of an information handling system including manifold system 1100 to be accessible from the front of the server rack by controlling the routing and spacing of the hoses. For example, routing holes 1122 may control separation between hoses connected to devices in the information handling system based on the locations of the routing holes within the bottom surface of hose guides 1114. A combination of quick-disconnects 1110 and 1112 and hose guides 1114 enable manifold system 1100 to have an optimal positioning, grouping, and routing of hoses from the supply and return manifolds 1106 and 1108 and the corresponding devices. Hose guides 1114 may also ensure a proper bend to each hose to prevent the hoses from stopping water flow within manifold system 1100.

Figure 12:
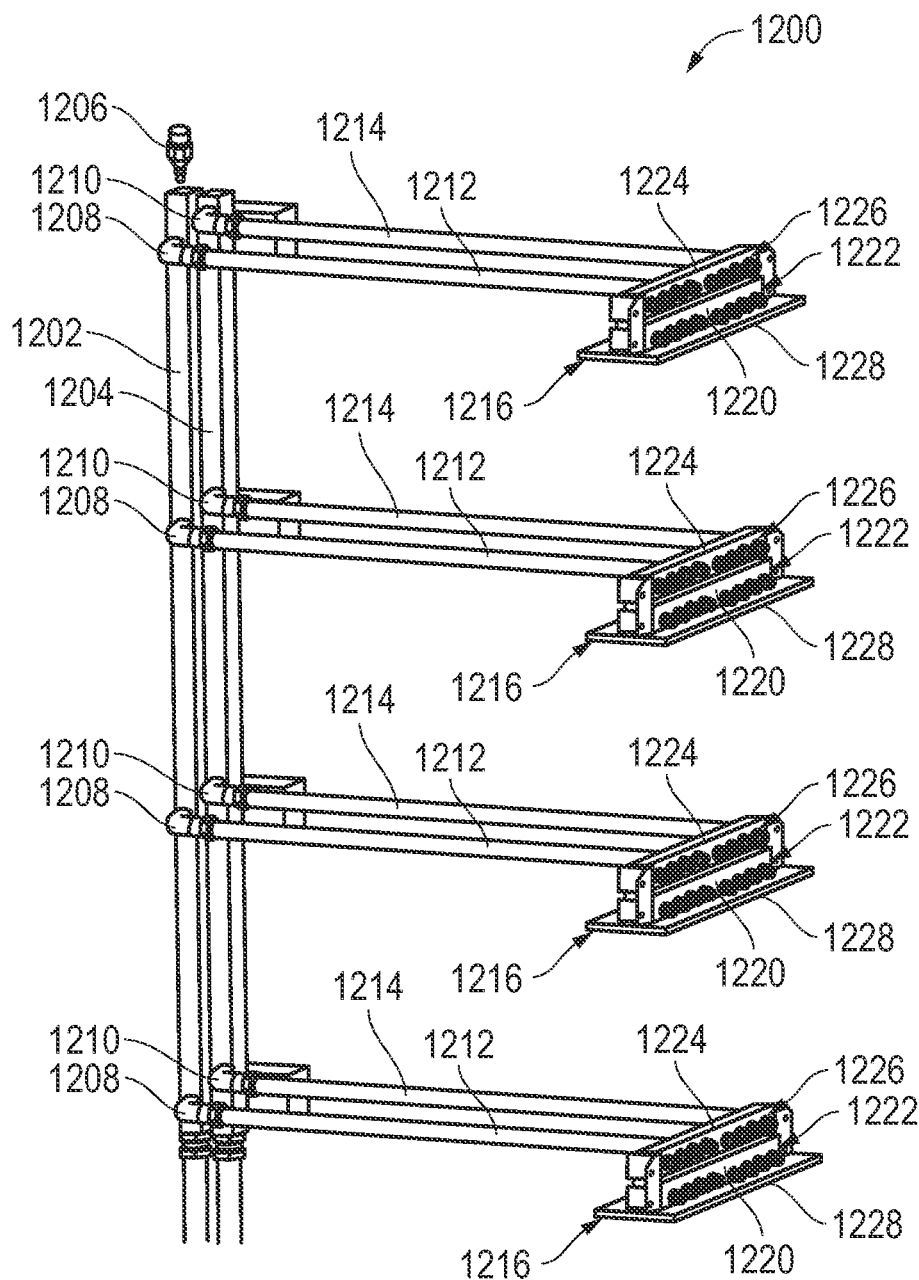
FIGS. 12 and 13 are diagrams of a modular horizontally oriented manifold system according to at least one embodiment of the disclosure.
Figure 13:
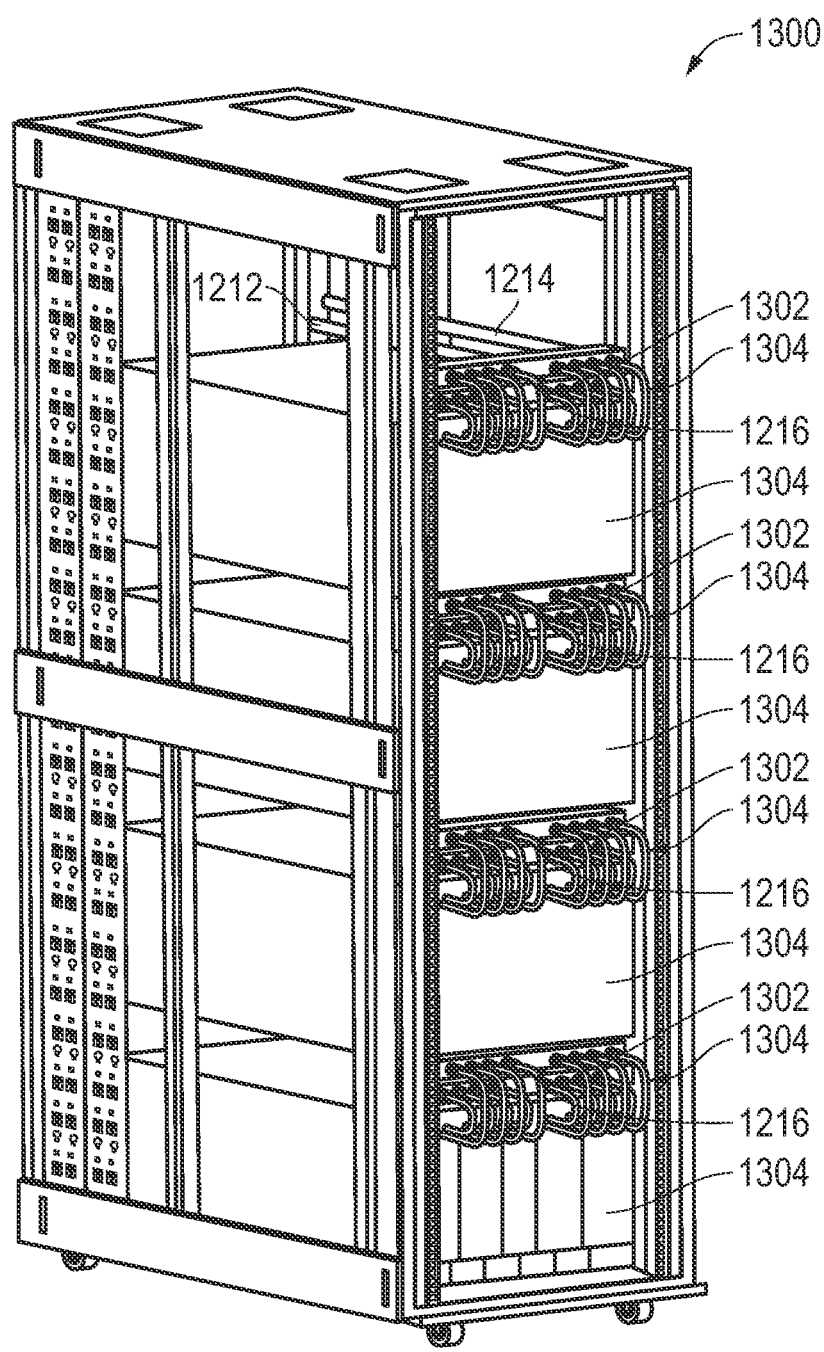

FIGS. 12 and 13 illustrate a modular horizontally oriented manifold system 1200 according to at least one embodiment of the disclosure. Referring now to FIG. 12, manifold system 1200 includes main supply line 1202, main return line 1204, vent 1206, main water connectors 1208 and 1210, supply lines 1212, return lines 1214, and manifolds 1216. Each manifold 1216 includes a supply manifold 1220 having quick-disconnects 1222, a return manifold 1224 having quick-disconnects 1226, and a drip pan 1228.

In an example, main supply line 1202 and main return line 1204 may be routed on any suitable side of a server rack, such as a left rear side of a server rack 1300. In this example, the location of main supply line 1202 and main return line 1204 may allow power distribution units in server rack 1300 to be mounted in a typical location of a right rear portion of the server rack. Main water connectors 1208 and supply lines 1212 may provide water from main supply line 1202 to a corresponding supply manifold 1220. Main water connectors 1210 and return lines 1214 may provide water from return manifolds 1224 to main supply line 1204.

In an example, supply manifold 1220, quick-disconnects 1222, return manifold 1224, quick-disconnects 1226, and drip trays 1228 of manifold units 1216 may operate in suitable manner including, but not limited to, the manner described above with respect manifold units 302 of FIG. 3.

Referring now to FIG. 13, manifold units 1216 may be installed in a horizontal orientation within server rack 1300 and provide vertical routing of hoses 1302 between quick-disconnects and vertical devices or server blades 1304 of an information handling system. As stated above, the routing of hoses of manifold units 1216 may enable individual blades to be serviced without removal of hoses for other server blades. In an example, supply lines 1212 and return lines 1214 may be routed in 2 U spaces in between vertical devices or server blades 1304 of an information handling system in server rack 1300. Similarly, manifold units 1216 may be routed in the 2 U spaces in between vertical devices or server blades 1304 of an information handling system in server rack 1300.

Figure 14:
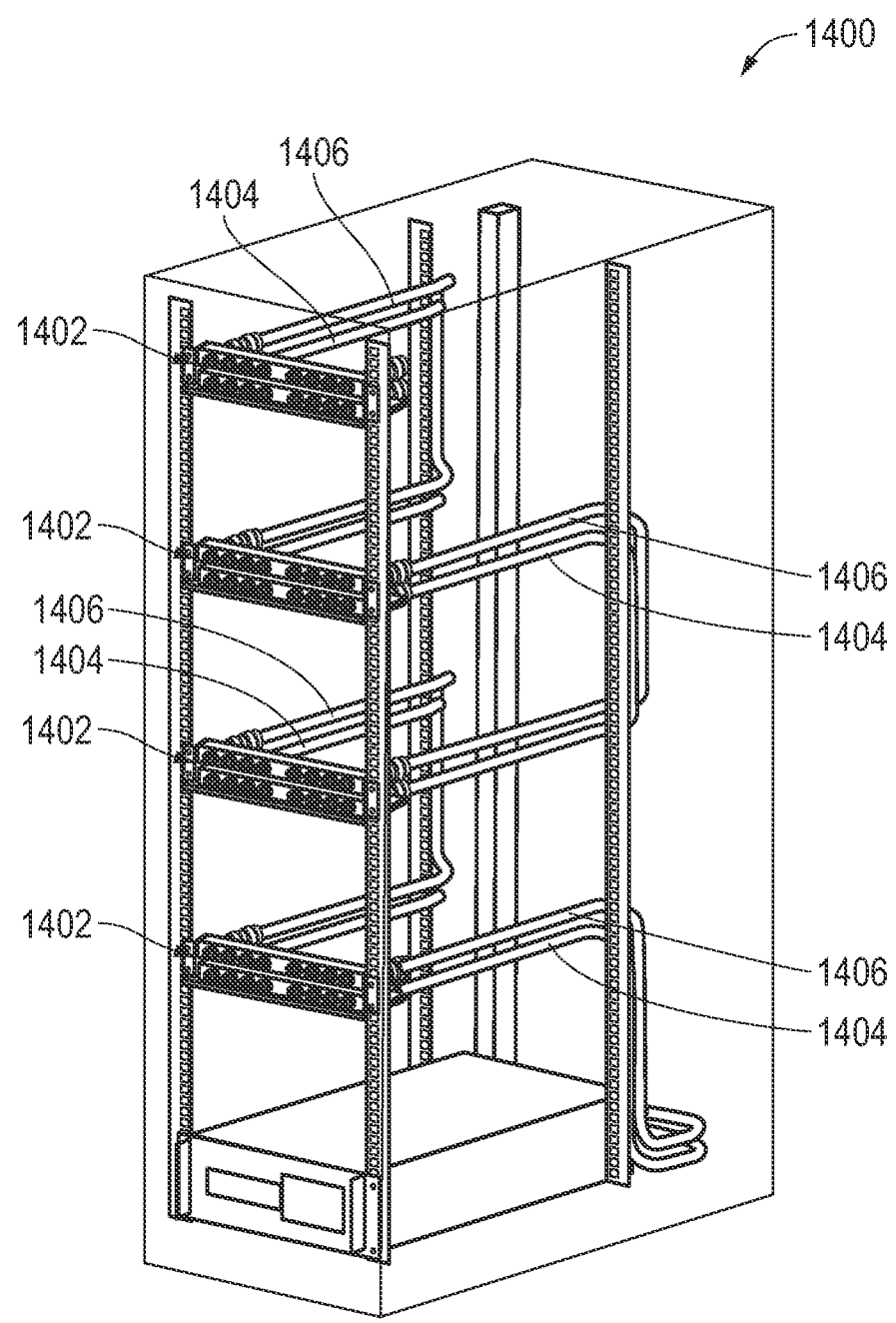
FIGS. 14 and 15 are diagrams of different embodiments a modular horizontally oriented manifold system in a server rack according to at least one embodiment of the disclosure.

FIG. 14 illustrates a modular horizontally oriented manifold system 1400 in a server rack according to at least one embodiment of the disclosure. Manifold system 1400 includes multiple manifold units 1402, main supply lines 1404, and main return lines 1406. In an example, manifold units 1402 may be substantially similar to manifold units 302 of FIG. 3 and may operate in substantially the same manner.

In an example, main supply lines 1404 and main return lines 1406 may be routed in any suitable 0U space of a server rack including, but not limited to, a space within the server rack. The routing of the main supply lines 1404 and main return lines 1406 may enable power distribution units to be mounted on the rear of the server rack without interface from the main supply and return lines. Manifold unit 1400 may not include central supply and return lines that the main supply lines 1404 and main return lines 1406 may branch off of. Instead, manifold system 1400 includes supply and return lines 1404 and 1406 connected in between consecutive manifold units 1402 of the manifold system, and a supply line and a return line connected in between a bottom most manifold unit and a central water distribution unit. In an example, supply and return lines 1404 and 1406 may be routed in 0 U spaces behind server blades of the information handling system and the 2 U spaces in between set of the server blades. In this example, supply and return lines 1404 and 1406 may not create substantial density interference within the server rack.

Figure 15:
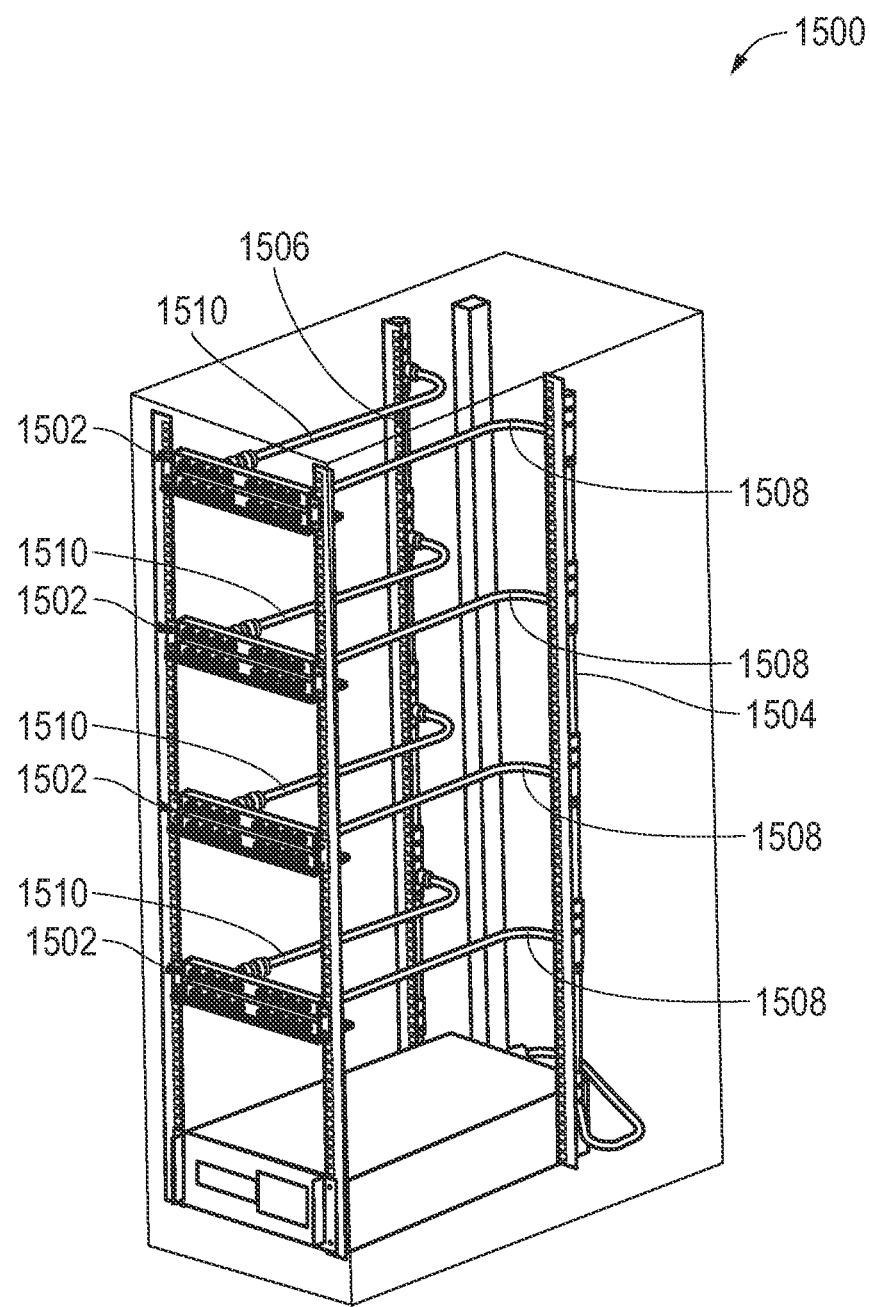

FIG. 15 illustrates a modular horizontally oriented manifold system 1500 in a server rack according to at least one embodiment of the disclosure. Manifold system 1500 includes multiple manifold units 1502, a main supply line 1504, a main return line 1506, multiple supply lines 1508, and multiple return lines 1510. In an example, manifold units 1502 may be substantially similar to manifold units 302 of FIG. 3 and may operate in substantially the same manner.

In an example, main supply line 1504 and main return line 1506 may be routed in any suitable 0U space of a server rack including, but not limited to, a space within the server rack. The routing of the main supply line 1504 and main return line 1506 may enable power distribution units to be mounted on the rear of the server rack without interface from the main supply and return lines. Manifold unit 1500 may include main supply and return lines 1504 and 1506 that supply lines 1508 and main return lines 1510 may branch off of. In an example, main supply and return lines 1504 and 1506 may be vertical and parallel within the server. Supply and return lines 1508 and 1510 for each manifold unit 1502 may be routed in the 2 U space in between set of the server blades already occupied by the corresponding manifold unit. In this example, supply and return lines 1508 and 1510 may not create substantial density interference within the server rack.

FIG. 16 illustrates a general information handling system 1600. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more busses operable to transmit communications between the various hardware components.

Information handling system 1600 including a processor 1602, a memory 1604, a chipset 1606, one or more PCIe buses 1608, a universal serial bus (USB) controller 1610, a USB bus 1612, a keyboard device controller 1614, a mouse device controller 1616, a configuration a SATA bus controller 1620, a SATA bus 1622, a hard drive device controller 1624, a compact disk read only memory (CD ROM) device controller 1626, a storage 1628, a graphics device controller 1630, a network interface controller (NIC) 1640, a wireless local area network (WLAN) or wireless wide area network (WWAN) controller 1650, a serial peripheral interface (SPI) bus 1660, a NVRAM 1670 for storing BIOS 1672, and a baseboard management controller (BMC) 1680. In an example, chipset 1606 may be directly connected to an individual end point via a PCIe root port within the chipset and a point-to-point topology as shown in FIG. 16. BMC 1680 can be referred to as a service processor or embedded controller (EC). Capabilities and functions provided by BMC 1680 can vary considerably based on the type of information handling system. For example, the term baseboard management system is often used to describe an embedded processor included at a server, while an embedded controller is more likely to be found in a consumer-level device. As disclosed herein, BMC 1680 represents a processing device different from CPU 1602, which provides various management functions for information handling system 1600. For example, an embedded controller may be responsible for power management, cooling management, and the like. An embedded controller included at a data storage system can be referred to as a storage enclosure processor.

System 1600 can include additional processors that are configured to provide localized or specific control functions, such as a battery management controller. Bus 1660 can include one or more busses, including a SPI bus, an I2C bus, a system management bus (SMBUS), a power management bus (PMBUS), and the like. BMC 1680 can be configured to provide out-of-band access to devices at information handling system 1600. As used herein, out-of-band access herein refers to operations performed prior to execution of BIOS 1672 by processor 1602 to initialize operation of system 1600.

BIOS 1672 can be referred to as a firmware image, and the term BIOS is herein used interchangeably with the term firmware image, or simply firmware. BIOS 1672 includes instructions executable by CPU 1602 to initialize and test the hardware components of system 1600, and to load a boot loader or an operating system (OS) from a mass storage device. BIOS 1672 additionally provides an abstraction layer for the hardware, such as a consistent way for application programs and operating systems to interact with the keyboard, display, and other input/output devices. When power is first applied to information handling system 1600, the system begins a sequence of initialization procedures. During the initialization sequence, also referred to as a boot sequence, components of system 1600 are configured and enabled for operation, and device drivers can be installed. Device drivers provide an interface through which other components of the system 1600 can communicate with a corresponding device.

Information handling system 1600 can include additional components and additional busses, not shown for clarity. For example, system 1600 can include multiple processor cores, audio devices, and the like. While a particular arrangement of bus technologies and interconnections is illustrated for the purpose of example, one of skill will appreciate that the techniques disclosed herein are applicable to other system architectures. System 1600 can include multiple CPUs and redundant bus controllers. One or more components can be integrated together. For example, portions of chipset 1606 can be integrated within CPU 1602. Additional components of information handling system 1600 can include one or more storage devices that can store machine-executable code, one or more communications ports for communicating with external devices, and various input and output (I/O) devices, such as a keyboard, a mouse, and a video display. An example of information handling system 1600 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

In an example, information handling system 1600 may be any suitable device including, but not limited to, server 402 of FIG. 4. Information handling system 1600 can include a set of instructions that can be executed to cause the information handling system to perform any one or more of the methods or computer based functions disclosed herein. The information handling system 1600 may operate as a standalone device or may be connected to other computer systems or peripheral devices, such as by a network.

In a networked deployment, the information handling system 1600 may operate in the capacity of a server or as a client user computer in a server-client user network environment, or as a peer computer system in a peer-to-peer (or distributed) network environment. The information handling system 1600 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 1600 can be implemented using electronic devices that provide voice, video or data communication. Further, while a single information handling system 1600 is illustrated, the term "system" shall also be taken to include any collection of systems or sub-systems that individually or jointly execute a set, or multiple sets, of instructions to perform one or more computer functions.

Information handling system 1600 can include a disk drive unit and may include a computer-readable medium, not shown in FIG. 16, in which one or more sets of instructions, such as software, can be embedded. Further, the instructions may embody one or more of the methods or logic as described herein. In a particular embodiment, the instructions may reside completely, or at least partially, within system memory 1604 or another memory included at system 1600, and/or within the processor 1602 during execution by the information handling system 1600. The system memory 1604 and the processor 1602 also may include computer-readable media.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A modular manifold system for liquid cooling in an information handling system, the modular manifold system comprising:
   a first horizontal manifold including:
      a first bottom surface;
      a first plurality of quick-disconnects mounted along a first surface of the first horizontal manifold; and
      a first main water connector mounted on the first surface, the first main water connector connected to and extending away from a first end of the first horizontal manifold; and
   a second horizontal manifold including:
      a first top surface in physical communication with the first bottom surface of the first horizontal manifold;
      a second bottom surface;
      a second plurality of quick-disconnects mounted along a second surface of the second horizontal manifold;
      a second main water connector mounted on the second surface, the second main water connector connected to and extending away from a second end of the second horizontal manifold, wherein the second main water connector on the second end of the second horizontal manifold is an opposite end from the first main water connector on the first end of the first horizontal manifold; and
   a drip tray in physical communication with the second bottom surface of the second horizontal manifold, the drip tray extending away from the second horizontal manifold in a direction perpendicular to the second surface and parallel to the second bottom surface, the drip tray to catch any water leaked from one or more of the first and second plurality of quick-disconnects.

2. The modular manifold system of claim 1, wherein the first horizontal manifold is stacked on top of the second horizontal manifold when the first and second horizontal manifolds are installed in a server rack.

3. The modular manifold system of claim 2, wherein the first and second horizontal manifolds extend from a first edge of the server rack to a second edge of the server rack.

4. The modular manifold system of claim 3, wherein the first horizontal manifold rotates around the first main water connector at the first edge of the server rack and latches to the second edge of the server rack.

5. The modular manifold system of claim 2, wherein the first and second horizontal manifolds are installed within a front of the server rack.

6. The modular manifold system of claim 1, wherein the second main water connector includes a first barb fitting extending in a first direction away from the second main water connector, the first barb fitting to connect the second main water connector to a supply line.

7. The modular manifold system of claim 6, wherein the second main water connector includes a second barb fitting extending in a second direction away from the second main water connector, the second barb fitting to connect the second horizontal manifold to a third horizontal manifold via a connector hose.

8. The modular manifold system of claim 1, wherein the first and second horizontal manifolds are mounted to a front of a server rack and extend along a depth of the server rack.

9. An information handling system comprising:
a server rack including one or more server blades, wherein the one or more server blades includes a first and second server blade; and
a modular manifold system for liquid cooling of the one or more server blades, the modular manifold system including:
a first horizontal manifold including:
a first bottom surface;
a first plurality of quick-disconnects mounted along a first surface of the first horizontal manifold, one of the first plurality of quick-disconnects to be coupled to a first cooling system of the first server blade via a first hose; and
a first main water connector mounted on the first surface, the first main water connector connects to and extends away from a first end of the first horizontal manifold; and
a second horizontal manifold including:
a first top surface in physical communication with the first bottom surface of the first horizontal manifold;
a second bottom surface;
a second plurality of quick-disconnects mounted along a second surface of the second horizontal manifold, one of the second plurality of quick-disconnects to be coupled to the first cooling system of the first server blade via a second hose;
a second main water connector mounted on the second surface, the second main water connector connects to and extends away from a second end of the second horizontal manifold, wherein the second main water connector on the second end of the second horizontal manifold is an opposite end from the first main water connector on the first end of the first horizontal manifold; and
a drip tray in physical communication with the second bottom surface of the second horizontal manifold, the drip tray extends away from the second horizontal manifold in a direction perpendicular to the second surface and parallel to the second bottom surface, the drip tray to catch any water leaked from one or more of the first and second plurality of quick-disconnects.

10. The modular manifold system of claim 9, wherein the first horizontal manifold is stacked on top of the second horizontal manifold in the server rack.

11. The modular manifold system of claim 10, wherein the first and second horizontal manifolds extend from a first edge of the server rack to a second edge of the server rack.

12. The modular manifold system of claim 11, wherein the first horizontal manifold rotates around the first main water connector at the first edge of the server rack and latches to the second edge of the server rack.

13. The modular manifold system of claim 10, wherein the first and second horizontal manifolds are installed within a front of the server rack.

14. The modular manifold system of claim 9, wherein the second main water connector includes a first barb fitting extending in a first direction away from the second main water connector, the first barb fitting to connect the second main water connector to a supply line.

15. The modular manifold system of claim 14, wherein the second main water connector includes a second barb fitting extending in a second direction away from the second main water connector, the second barb fitting to connect the second horizontal manifold to a third horizontal manifold via a connector hose.

16. The modular manifold system of claim 9, wherein the first and second horizontal manifolds are mounted to a front of the server rack and extend along a depth of the server rack.

17. An information handling system comprising:
a server rack including one or more server blades, the one or more server blades include first and second server blades, the one or more server blades include power and network cables in a rear of the server rack; and
a modular manifold system for liquid cooling of the one or more server blades, the modular manifold system comprising:
a first horizontal manifold mounted in a front of the server rack, the first horizontal manifold including:
a first bottom surface;
a first plurality of quick-disconnects mounted along a first surface of the first horizontal manifold, one of the first plurality of quick-disconnects to be coupled to a first cooling system of the first server blade via a first hose; and
a first main water connector mounted on the first surface, the first main water connector connects to and extends away from a first end of the first horizontal manifold and is coupled to a return line in the rear of the server rack; and
a second horizontal manifold mounted in the front of the server rack, the second horizontal manifold including:
a first top surface in physical communication with the first bottom surface of the first horizontal manifold;
a second bottom surface;
a second plurality of quick-disconnects mounted along a second surface of the second horizontal manifold, one of the second plurality of quick-disconnects to be coupled to the first cooling system of the first server blade via a second hose;
a second main water connector mounted on the second surface, the second main water connector connects to and extends away from a second end of the second horizontal manifold and is coupled to a supply line in the rear of the server rack, wherein the second main water connector on the second end of the second horizontal manifold is an opposite end from the first main water connector on the first end of the first horizontal manifold; and
a drip tray in physical communication with the second bottom surface of the second horizontal manifold, the drip tray extends away from the second horizontal manifold in a direction perpendicular to the second surface and parallel to the second bottom surface, the drip tray to catch any water leaked from one or more of the first and second plurality of quick-disconnects.

18. The modular manifold system of claim 17, wherein the first horizontal manifold is stacked on top of the second horizontal manifold in the server rack.

19. The modular manifold system of claim 17, wherein the first horizontal manifold rotates around the first main water connector at a first edge of the server rack and latches to a second edge of the server rack.

20. The modular manifold system of claim 17, wherein the first and second horizontal manifolds are mounted to the front of the server rack and extend along a depth of the server rack.

* * * * *